United States Patent
Bai et al.

(10) Patent No.: US 12,490,379 B2
(45) Date of Patent: Dec. 2, 2025

(54) DISPLAY MODULE, METHOD FOR MANUFACTURING THE SAME, AND DISPLAY DEVICE

(71) Applicants: YUNNAN INVENSIGHT OPTOELECTRONICS TECHNOLOGY CO., LTD., Yunnan (CN); BOE TECHNOLOGY GROUP CO., LTD., Beijing (CN)

(72) Inventors: Xiao Bai, Beijing (CN); Shengji Yang, Beijing (CN); Pengcheng Lu, Beijing (CN)

(73) Assignees: Yunnan Invensight Optoelectronics Technology Co., Ltd., Yunnan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/022,418

(22) PCT Filed: Jan. 17, 2022

(86) PCT No.: PCT/CN2022/072264
§ 371 (c)(1),
(2) Date: Feb. 21, 2023

(87) PCT Pub. No.: WO2023/133874
PCT Pub. Date: Jul. 20, 2023

(65) Prior Publication Data
US 2024/0268025 A1    Aug. 8, 2024

(51) Int. Cl.
*H01L 23/00* (2006.01)
*H01L 23/498* (2006.01)
(Continued)

(52) U.S. Cl.
CPC ........ *H05K 1/117* (2013.01); *H01L 23/49838* (2013.01); *H01L 24/06* (2013.01);
(Continued)

(58) Field of Classification Search
CPC .... H05K 1/117; H05K 1/18; H05K 2201/094; H05K 2201/09409; H05K 2201/10128;
(Continued)

(56) References Cited

U.S. PATENT DOCUMENTS 6,403,895 B1     6/2002 Sota
2002/0185744 A1  12/2002 Katagiri et al.
(Continued)

FOREIGN PATENT DOCUMENTS

CN    101609872 A    12/2009
CN    103311210 A     9/2013
(Continued)

*Primary Examiner* — Elias Ullah
(74) *Attorney, Agent, or Firm* — BROOKS KUSHMAN P.C.

(57) ABSTRACT

A display module, a method for manufacturing the same, and a display device. The display module includes: a first bonding region of a circuit board is provided with a first row of circuit board pads and a second row of circuit board pads, and each row of circuit board pads comprises multiple circuit board pads arranged at intervals in a first direction; a second bonding region of the display substrate is provided with a plurality of substrate pads arranged in the first direction, an orthographic projection of the display substrate onto the circuit board does not overlap the first bonding region, and the second bonding region is close to the first bonding region. The circuit board pads are bonded to the substrate pads via suspended wires. The second row of circuit board pads comprises first circuit board pads and second circuit board pads.

20 Claims, 3 Drawing Sheets

(51) Int. Cl.
  *H05K 1/11* (2006.01)
  *H05K 1/18* (2006.01)
(52) U.S. Cl.
  CPC .............. *H01L 24/45* (2013.01); *H01L 24/48* (2013.01); *H01L 24/49* (2013.01); *H05K 1/18* (2013.01); *H01L 2224/06135* (2013.01); *H01L 2224/45124* (2013.01); *H01L 2224/45144* (2013.01); *H01L 2224/48091* (2013.01); *H01L 2224/48106* (2013.01); *H01L 2224/48108* (2013.01); *H01L 2224/48227* (2013.01); *H01L 2224/4903* (2013.01); *H01L 2224/49175* (2013.01); *H05K 2201/094* (2013.01); *H05K 2201/09409* (2013.01); *H05K 2201/10128* (2013.01)
(58) Field of Classification Search
  CPC ... H05K 1/111; H01L 23/49838; H01L 24/06; H01L 24/45; H01L 24/48; H01L 24/49; H01L 2224/06135; H01L 2224/45124; H01L 2224/45144; H01L 2224/48091; H01L 2224/48106; H01L 2224/48108; H01L 2224/48227; H01L 2224/4903; H01L 2224/49175; G02F 1/1345; G02F 1/1362

See application file for complete search history.

(56) References Cited

U.S. PATENT DOCUMENTS

| | | |
|---|---|---|
| 2013/0234306 A1 | 9/2013 | Qiu et al. |
| 2017/0263891 A1 | 9/2017 | Oh et al. |

FOREIGN PATENT DOCUMENTS

| | | |
|---|---|---|
| CN | 107180850 A | 9/2017 |
| CN | 206961822 U | 2/2018 |
| CN | 109856734 A | 6/2019 |
| CN | 110286535 A | 9/2019 |
| KR | 20080113637 A | 12/2008 |

DISPLAY MODULE, METHOD FOR MANUFACTURING THE SAME, AND DISPLAY DEVICE

CROSS-REFERENCE TO RELATED APPLICATION

This application is the U.S. national phase of PCT Application No. PCT/CN2022/072264 filed on Jan. 17, 2022, which is incorporated herein by reference in its entirety.

TECHNICAL FIELD

The present disclosure relates to the technical field of displays, and in particular to a display module, a method for manufacturing the same, and a display device.

BACKGROUND

OLED (Organic Light-Emitting Diode) display devices have been listed as the most promising next-generation display technology due to their advantages such as thin thickness, light weight, wide viewing angle, active light emission, continuously adjustable emission color, low cost, fast response, low power consumption, low driving voltage, wide operating temperature range, simple production process, high light emission efficiency and flexible display.

The silicon-based OLED microdisplay is a display device that integrates millions or more light-emitting pixels on a substrate (silicon-based material) with a size of less than 2 inches. Recently, with the emergence of high-tech products such as augmented reality (AR)/virtual reality (VR), the requirements on silicon-based OLED microdisplays are increasing.

SUMMARY

The technical problem to be solved by the present disclosure is to provide a display module, a method for manufacturing the same, and a display device, which can improve the process yield and reliability of the display module.

In order to solve the above technical problem, embodiments of the present disclosure provide the following technical solutions.

In an aspect, a display module is provided, including:
a circuit board, where the circuit board includes a first bonding region, the first bonding region is provided with two rows of circuit board pads, and each row of circuit board pads includes a plurality of circuit board pads arranged at intervals in a first direction; and
a display substrate on the circuit board, where the display substrate includes a second bonding region, the second bonding region is provided with a plurality of substrate pads arranged in the first direction, an orthographic projection of the display substrate onto the circuit board does not overlap the first bonding region, and the second bonding region is close to the first bonding region,
where the circuit board pads are bonded to the substrate pads via suspended wires; the two rows of circuit board pads include a first row of circuit board pads and a second row of circuit board pads, the second row of circuit board pads includes first circuit board pads and second circuit board pads, the first circuit board pads and the second circuit board pads are arranged alternately, the second circuit board pads are not provided with a wire bonded to the substrate pads, and a distance between the first row of circuit board pads is smaller than a distance between the second row of circuit board pads.

In some embodiments, an area of an orthographic projection of one of the first circuit board pads onto the display substrate is greater than an area of an orthographic projection of one of the second circuit board pads onto the display substrate.

In some embodiments, an area of an orthographic projection of one of the first circuit board pads onto the display substrate is greater than an area of one of the substrate pads, and an area of an orthographic projection of one the second circuit board pads onto the display substrate is greater than the area of one of the substrate pads.

In some embodiments, in the second row of circuit board pads, the first circuit board pads and the second circuit board pads are arranged alternately, and the number of the first circuit board pads is equal to the number of the second circuit board pads.

In some embodiments, the substrate pads include a plurality of groups of first pads configured to transmit high-speed differential signals and second pads other than the first pads, each group of first pads includes two first pads without any second pad arranged therebetween, at least one of the second pads is provided between two adjacent groups of first pads, and lengths of wires connected between first pads in each group of first pads and corresponding circuit board pads are equal.

In some embodiments, a length of a wire for connecting one of the second row of circuit board pads with a corresponding one of the substrate pads is greater than a length of a wire for connecting one of the first row of circuit board pads with a corresponding one of the substrate pads.

In some embodiments, a maximum width of one of the circuit board pads in a second direction is greater than a maximum width of the one circuit board pad in the first direction, the second direction being perpendicular or substantially perpendicular to the first direction.

In some embodiments, the second circuit board pads are located in the middle of the second row of circuit board pads.

In some embodiments, an included angle between a first orthographic projection of a connecting line between one of the first row of circuit board pads and a corresponding one of the substrate pads onto the circuit board and an extending direction of the first row of circuit board pads is smaller than an included angle between a first orthographic projection of a connecting line between one of the second row of circuit board pads and a corresponding one of the substrate pads onto the circuit board and an extending direction of the second row of circuit board pads.

In some embodiments, a distance between the first row of circuit board pads and the second row of circuit board pads is smaller than a distance between adjacent circuit board pads in the first row of circuit board pads.

In some embodiments, an orthographic projection of the first bonding region in the first direction exceeds an orthographic projection of the second bonding region in the first direction, and a minimum distance between a first boundary of the first bonding region in a second direction and a second boundary of the second bonding region in the second direction is smaller than a first preset threshold, the second direction being perpendicular or substantially perpendicular to the first direction.

In some embodiments, an orthographic projection of the first bonding region in the first direction is located within an orthographic projection of the second bonding region in the first direction.

In some embodiments, included angles between the wires and a second direction are less than a second preset threshold, the second direction being perpendicular or substantially perpendicular to the first direction.

In some embodiments, an extending length of the first bonding region along the first direction is larger than an extending length of the second bonding region along the first direction.

In some embodiments, circuit board pads in the first row of circuit board pads are staggered, in the first direction, from circuit board pads in the second row of circuit board pads.

In some embodiments, a length of a wire connected between each group of first pads and a corresponding one of the circuit board pads is larger than a distance between the first row of circuit board pads and the second row of circuit board pads in a second direction, the second direction being perpendicular or substantially perpendicular to the first direction.

In some embodiments, a display region of the display substrate includes a plurality of sub-pixels, and a distance between the first row of circuit board pads and the second row of circuit board pads in a second direction is larger than a maximum width of one of the sub-pixels, the second direction being perpendicular or substantially perpendicular to the first direction.

In some embodiments, a maximum width of one of the second circuit board pads in a second direction is smaller than a maximum width of one of the first circuit board pads in the second direction, the second direction being perpendicular or substantially perpendicular to the first direction.

In some embodiments, the number of the first circuit board pads is greater than the number of the second circuit board pads.

An embodiment of the present disclosure further provides a display device including the display module described above.

An embodiment of the present disclosure further provides a method for manufacturing a display module, which includes the following steps:
  providing a circuit board, where the circuit board includes a first bonding region, the first bonding region is provided with two rows of circuit board pads each row of circuit board pads includes a plurality of circuit board pads arranged at intervals in a first direction;
  forming a display substrate on the circuit board, where the display substrate includes a second bonding region, the second bonding region is provided with a plurality of substrate pads arranged in the first direction, an orthographic projection of the display substrate onto the circuit board does not overlap the first bonding region, and the second bonding region is close to the first bonding region; and
  forming suspended wires for bonding the circuit board pads to the substrate pads,
  where the two rows of circuit board pads include a first row of circuit board pads and a second row of circuit board pads, the second row of circuit board pads includes first circuit board pads and second circuit board pads, the first circuit board pads and the second circuit board pads are arranged alternately, the second circuit board pads are not provided with a wire bonded to the substrate pads, and a distance between the first row of circuit board pads is smaller than a distance between the second row of circuit board pads.

The embodiments of present disclosure has the following beneficial effects. In the technical solutions described above, two rows of circuit board pads are arranged on the circuit board, so that the circuit board pads are arranged to be more concentrated, which can reduce the width of the first bonding region, make the circuit board pads closer to the substrate pads, reduce the length of the wire for bonding the circuit board pad to the substrate pad, and can increase the bonding angle of the wire, thereby ensuring the reliability of the wire bonding process.

REFERENCE SIGNS

1 Display substrate
2 Circuit board
3 Protective coating
4 Wire
5 Circuit board pad
6 Substrate pad
61 First pad
62 Second pad
53 First circuit board pad
52 Second circuit board pad

DETAILED DESCRIPTION

In order that the to-be-solved technical problems, technical solutions, and advantages of the embodiments of the present disclosure will become more apparent, a detailed description will be given below with reference to the accompanying drawings and specific embodiments.

Figure 1:
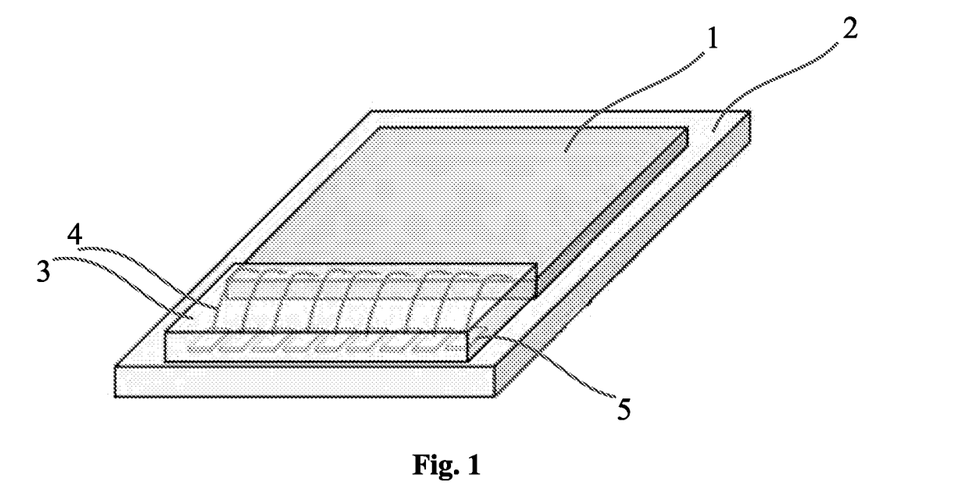
FIG. 1 and FIG. 2 each is a schematic diagram of a display module in the related art.
Figure 2:
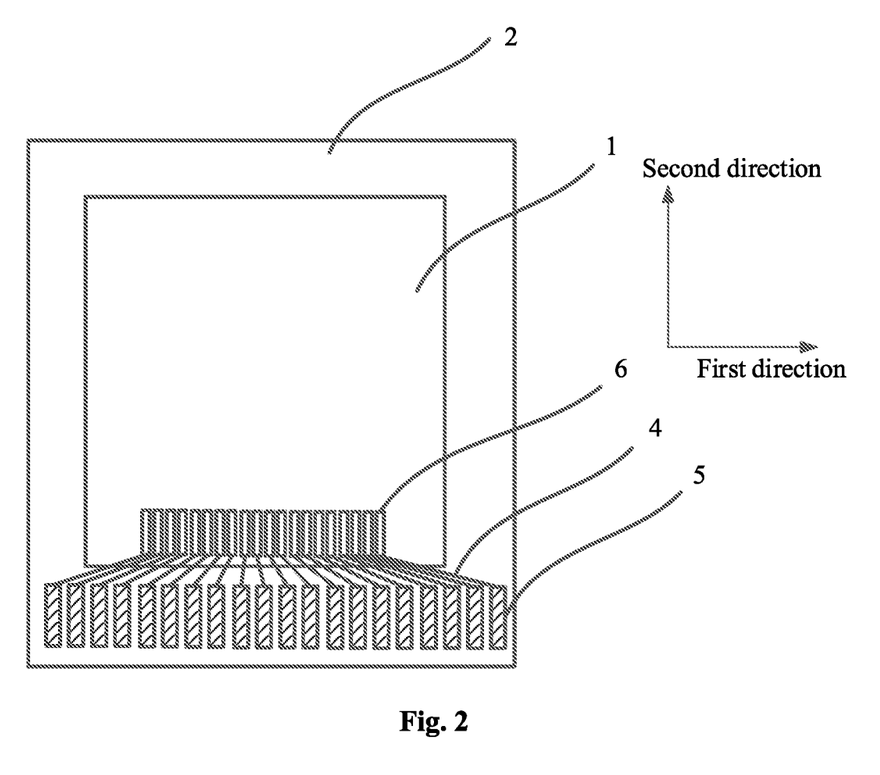

As shown in FIG. 1 and FIG. 2, in an display module in the related art, a row of circuit board pads 5 is provided on a circuit board 2, and the circuit board pads 5 are arranged in a first direction; a row of substrate pads 6 is arranged on a display substrate 1, and the substrate pads 6 are arranged in the first direction. The circuit board pads 5 and the substrate pads 6 are bonded by wires 4, and a protective coating 3 is coated on the circuit board pads 5, the wires 4 and the substrate pads 6. The process of bonding the circuit board pads 5 and the substrate pads 6 via the wires 4 is referred to as a wire bonding process. Since the manufacturing accuracy of the circuit board is much lower than that of the display substrate, the width of the region where the circuit board pads are located will be much greater than the width of the display substrate, when the number of circuit board pads is equal to the number of substrate pads. As a result, when performing the wire bonding process, it can be clearly seen that the length of a wire 4 between a circuit board pad 5 at the edge and a corresponding substrate pad 6 will be relatively large, and the bonding angle (an included angle between the wire 4 and the first direction) will be significantly smaller. These are extremely detrimental to the reliability of the wire bonding process.

The embodiments of the present disclosure provides a display module, a method for manufacturing the same, and a display device, which can improve the process yield and reliability of the display module.

An embodiment of the present disclosure provides a display module, which includes:

a circuit board, where the circuit board includes a first bonding region, the first bonding region is provided with two rows of circuit board pads, and each row of circuit board pads includes a plurality of circuit board pads arranged at intervals in a first direction; and a display substrate on the circuit board, where the display substrate includes a second bonding region, the second bonding region is provided with a plurality of substrate pads arranged in the first direction, an orthographic projection of the display substrate onto the circuit board does not overlap the first bonding region, and the second bonding region is close to the first bonding region, where the circuit board pads are bonded to the substrate pads via suspended wires; the two rows of circuit board pads include a first row of circuit board pads and a second row of circuit board pads, the second row of circuit board pads includes first circuit board pads and second circuit board pads, the first circuit board pads and the second circuit board pads are arranged alternately, the second circuit board pads are not provided with a wire bonded to the substrate pads, and a distance between the first row of circuit board pads is smaller than a distance between the second row of circuit board pads.

In the embodiments, two rows of circuit board pads are arranged on the circuit board, so that the circuit board pads are arranged to be more concentrated, which can reduce the width of the first bonding region, make the circuit board pads closer to the substrate pads, reduce the length of the wire for bonding the circuit board pad to the substrate pad, and can increase the bonding angle of the wire, thereby ensuring the reliability of the wire bonding process.

The wire may be made of a metal having good electrical conductivity, such as aluminum, gold, etc. The display substrate may be a silicon-based display substrate. However, the display substrate is not limited to a silicon-based display substrate, and may be other types of display substrates.

Due to the arrangement of the second circuit board pads, the number of the circuit board pads may be slightly greater than the number of the substrate pads.

Figure 3:
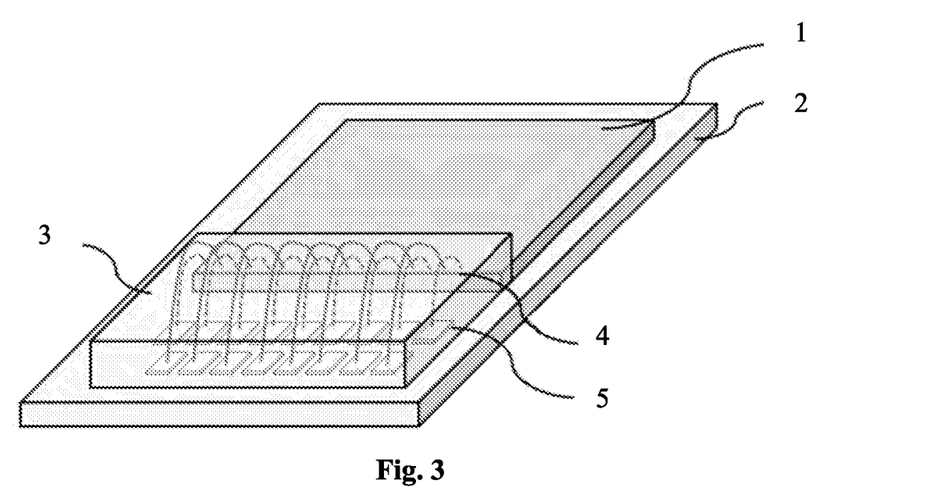
FIG. 3 to FIG. 5 each is a schematic diagram of a display module according to an embodiment of the present disclosure.

In an embodiment, the first bonding region may be provided not only with two rows of circuit board pads, but also with three or more rows of circuit board pads. In a particular example, as shown in FIGS. 3 to 5, the circuit board 2 is provided with two rows of circuit board pads 5, and the circuit board pads 5 are all arranged in a first direction; a row of substrate pads 6 is arranged on the display substrate 1, and the substrate pads 6 are arranged in the first direction; the circuit board pads 5 and the substrate pads 6 are bonded by the wires 4.

Figure 4:
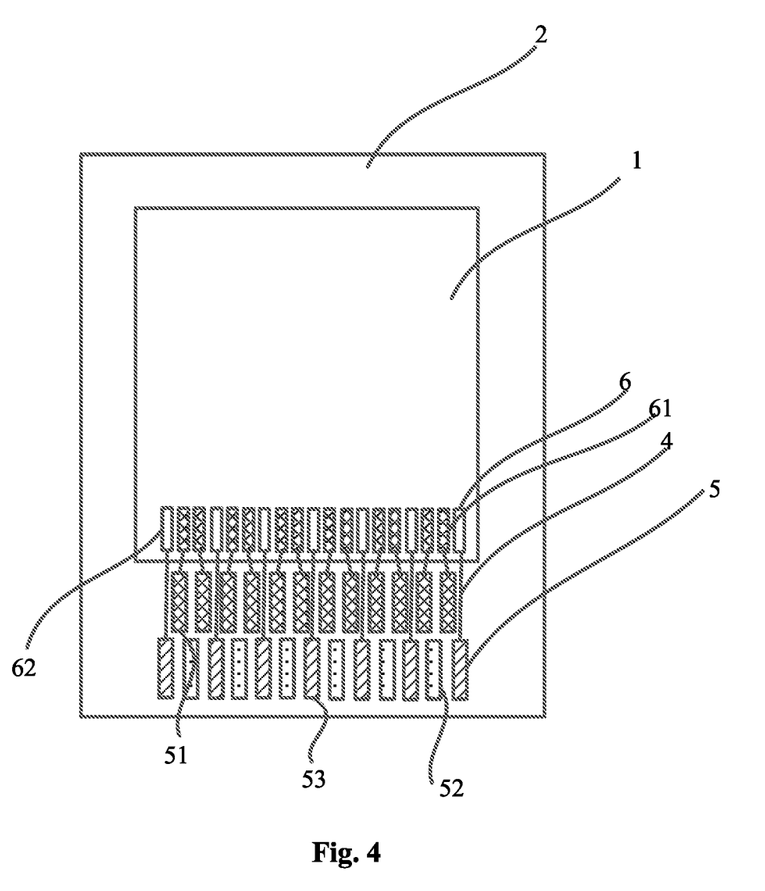
Figure 5:
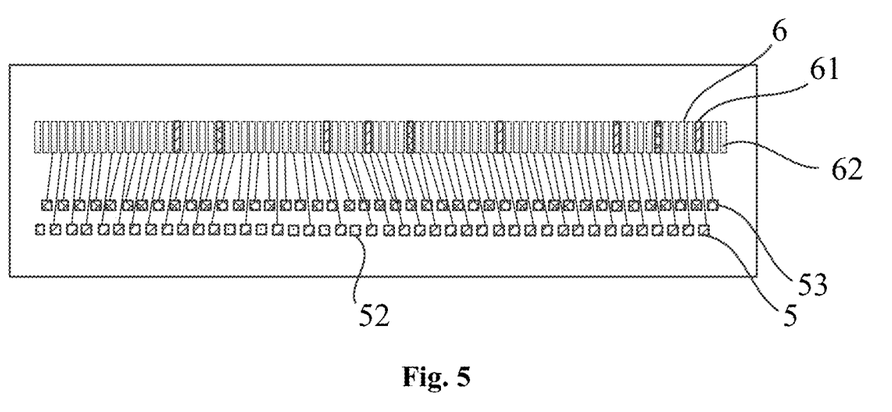

In some embodiments, as shown in FIGS. 4 and 5, the at least two rows of circuit board pads include a first row of circuit board pads and a second row of circuit board pads, the substrate pads include a plurality of groups of first pads 61 for transmitting high-speed differential signals and second pads 62 other than the first pads, each group of the first pads includes two first pads 61 without any second pads 62 provided between the two first pads 61, and at least one second pad 62 is provided between two adjacent groups of first pads 61.

In order to ensure the integrity of the high-speed differential signals, wires 4 connected to the same group of first pads 61 need to meet the requirement of equal length and width, and lengths of wires for connecting each group of first pads with the corresponding circuit board pads are equal.

In order to ensure the integrity of the high-speed differential signals, as shown in FIG. 4, all of the first pads 61 are bonded in one-to-one correspondence to the circuit board pads of the first row of circuit board pads. The number of first pads 61 may or may not be equal to the number of circuit board pads of the first row of circuit board pads. In an embodiment, the first pads 61 in the same group are connected to two closest circuit board pads in the same row, and the wires 4 connected to the first pads 61 in same group can meet the requirement of having the equal length and width, thereby ensuring the integrity of high-speed differential signals.

In some embodiments, in order to reduce the length of the wire 4 connected to the first pads 61, the second row of circuit board pads may be located on a side of the first row of circuit board pads away from the display substrate. Of course, the second row of circuit board pads may also be located on a side of the first row of circuit board pads close to the display substrate.

When the second row of circuit board pads are located on the side of the first row of circuit board pads away from the display substrate, a length of a wire connected between the second row of circuit board pads and the substrate pad is greater than a length of a wire connected between the first row of circuit board pads and the substrate pad.

In some embodiments, as shown in FIG. 4, since the first pads are all bonded and connected to the first row of circuit board pads, and the number of circuit board pads bonded to the second pads is relatively small in the second row of circuit board pads. In order to ensure the uniform arrangement of the second row of circuit board pads, the second row of circuit board pads includes first circuit board pads 53 and second circuit board pads 52, the first circuit board pads 53 and the second circuit board pads 52 are arranged alternately, the second circuit board pads 52 are not provided with a wire bonded to the substrate pads, and the number of the first circuit board pads 53 may be greater than the number of the second circuit board pads 52. In order to ensure a reliable connection between the first circuit boards pad and the substrate pads, the area of an orthographic projection of the first circuit board pads 53 onto the display substrate may be greater than the area of an orthographic projection of the second circuit board pads 52 onto the display substrate. In particular, a maximum width of the second circuit board pad in the second direction is smaller than a maximum width of the first circuit board pad in the second direction, and a maximum width of the second circuit board pad in the first direction may be smaller than or equal to a maximum width of the first circuit board pad in the first direction.

In some embodiments, since the first pads are all bonded and connected to the first row of circuit board pads, and the number of circuit board pads bonded to the second pads needs to be relatively small in the second row of circuit board pads, and the second row may be provided with a smaller number of circuit board pads. In order to ensure the uniform arrangement of the second row of circuit board pads, the distance between the first row of circuit board pads (namely, the distance between adjacent circuit pads in the first row of circuit board pads) is smaller than the distance between the second row of circuit board pads (namely, the distance between adjacent circuit pads in the second row of circuit board pads). For example, the distance between adjacent circuit board pads in the first row of circuit board pads is d, and the width of the circuit board pad in the first direction is S; the distance between adjacent circuit board pads in the second row of circuit board pads is 2d+S. By means of the technical solution of the present embodiment, it can be ensured that two signal wires of the same pair of high-speed differential signals are on the same side of the circuit board pads in the bonding process, so as to ensure the integrity of the high-speed differential signals.

In some embodiments, since the substrate pads arranged in one row occupy a relatively small layout space, and the circuit board pads arranged in two rows occupy a relatively large layout space, the area of the orthographic projection of the first circuit board pad onto the display substrate is greater than the area of the substrate pad, and the area of the orthographic projection of the second circuit board pad onto the display substrate is greater than the area of the substrate pad, so that the difficulty of bonding can be reduced.

In some embodiments, as shown in FIG. 5, the second circuit board pads 52 are located in the middle of the second row of circuit board pads. Of course, the second circuit board pads 52 are not limited to being located in the middle of the second row of circuit board pads, but may be located in other regions of the second row of circuit board pads.

In some embodiments, since the distance between the second row of circuit board pad and the substrate pad is larger, and the bonding angle of the second row of circuit board pads may be reduced, an included angle between a first orthographic projection of a connecting line between the first row of circuit board pad and the substrate pad onto the circuit board and an extending direction of the first row of circuit board pads is smaller than an included angle between a first orthographic projection of a connecting line between the second row of circuit board pad and the substrate pad onto the circuit board and an extending direction of the second row of circuit board pads.

In some embodiments, in order to prevent the wire 4 from contacting the circuit board pads, the length of a wire for connecting each group of first pads to a corresponding circuit board pad is greater than a distance between the first row of circuit board pad and the second row of circuit board pad in a second direction, the second direction being perpendicular or substantially perpendicular to the first direction.

In order to prevent contact between different wires 4, as shown in FIGS. 3 and 4, the circuit board pads in the first row of circuit board pads are staggered from the circuit board pads in the second row of circuit board pads in the first direction, and the circuit board pads in the adjacent two rows of circuit board pads are staggered by a set distance in the first direction.

In some embodiments, the set distance may be one half of S, S is a width of the circuit board pad in the first direction. Of course, the set distance is not limited to one half of S, but may be another value.

In this embodiment, by providing multiple rows of circuit board pads, the number of circuit board pads in a single row can be reduced, the width of the first bonding region is reduced, and the first bonding region may be closer to the middle of the display substrate, so that the distance between a circuit board pad at the edge of the first bonding region and a substrate pad at the edge of the second bonding region is reduced as far as possible. As such, the length of the wire 4 can be reduced, the included angle between the wire 4 and the second direction can be smaller than a second preset threshold, and the bonding angle can be increased, thereby to ensure the reliability of the wire bonding process. The second direction is perpendicular or substantially perpendicular to the first direction.

In order to minimize the width of the first bonding region in the first direction, a maximum width of the circuit board pad 5 in a second direction is greater than a maximum width of the circuit board pad 5 in the first direction, the second direction being perpendicular or substantially perpendicular to the first direction.

In some embodiments, in order to reduce the width of the first bonding region in the second direction, a distance between the first row of circuit board pads and the second row of circuit board pads is smaller than a distance between adjacent circuit board pads in the first row of circuit board pads.

In some embodiments, an orthographic projection of the first bonding region in the first direction exceeds an orthographic projection of the second bonding region in the first direction, and a minimum distance between a first boundary of the first bonding region in a second direction and a second boundary of the second bonding region in the second direction is smaller than a first preset threshold, the second direction being perpendicular to the first direction. This ensures that a distance between the circuit board pad at the edge of the first bonding area and the substrate pad at the edge of the second bonding area is as small as possible. Of course, in an embodiment, an extending length of the first bonding region in the first direction may be greater than an extending length of the second bonding region in the first direction.

In some embodiments, an orthographic projection of the first bonding region in the first direction may be located within an orthographic projection of the second bonding region in the first direction. This ensures that the distance between the circuit board pad at the edge of the first bonding area and the substrate pad at the edge of the second bonding area is as small as possible.

In some embodiments, as shown in FIG. 3, the first row of circuit board pads are bonded to the substrate pads via first wires, the second row of circuit board pads are bonded to the substrate pads via second wires, the second row of circuit board pads are located on a side of the first row of circuit board pads away from the display substrate, the first wire and the second wire are arc-shaped wires, and the first wire is located on a side of the second wire close to the circuit board. In an embodiment, arcs of two wires are designed with different heights, which can avoid mutual interference between wires bonded to two rows of circuit board pads.

In some embodiments, the display region of the display substrate includes a plurality of sub-pixels, a distance between the first row of circuit board pad and the second row of circuit board pad in a second direction is greater than a maximum width of one of the sub-pixels, the second direction being perpendicular or substantially perpendicular to the first direction. In this way, mutual interference between wires bonded to two rows of circuit board pads can be prevented.

An embodiment of the present disclosure further provides a display device including the display module described above.

The display device includes, but not limited to: a radio frequency unit, a network module, an audio output unit, an input unit, a sensor, a display unit, a user input unit, an interface unit, a memory, a processor, a power supply, etc. It will be appreciated by those skilled in the art that the configuration of the display device described above is not constructed as a limitation to a display device, and the display device may include more or fewer of the components described above, or some combinations of the components, or different arrangements of the components. In embodiments of the present disclosure, the display device includes, but is not limited to, a display, a cell phone, a tablet, a television, a wearable electronic device, a navigation display device, etc.

The display device may be: any product or component with a display function, such as a television, a display, a digital photo frame, a mobile phone, a tablet computer, and among others, the display device further includes a flexible circuit board, a printed circuit board and a back panel.

An embodiment of the present disclosure further provides a method for manufacturing a display module, which includes the following steps:

providing a circuit board, where the circuit board includes a first bonding region, the first bonding region is provided with two rows of circuit board pads each row of circuit board pads includes a plurality of circuit board pads arranged at intervals in a first direction;

forming a display substrate on the circuit board, where the display substrate includes a second bonding region, the second bonding region is provided with a plurality of substrate pads arranged in the first direction, an orthographic projection of the display substrate onto the circuit board does not overlap the first bonding region, and the second bonding region is close to the first bonding region; and forming suspended wires for bonding the circuit board pads to the substrate pads, where the two rows of circuit board pads include a first row of circuit board pads and a second row of circuit board pads, the second row of circuit board pads includes first circuit board pads and second circuit board pads, the first circuit board pads and the second circuit board pads are arranged alternately, the second circuit board pads are not provided with a wire bonded to the substrate pads, and a distance between the first row of circuit board pads is smaller than a distance between the second row of circuit board pads.

In the embodiments, two rows of circuit board pads are arranged on the circuit board, so that the circuit board pads are arranged to be more concentrated, which can reduce the width of the first bonding region, make the circuit board pads closer to the substrate pads, reduce the length of the wire for bonding the circuit board pad to the substrate pad, and can increase the bonding angle of the wire, thereby ensuring the reliability of the wire bonding process.

The wire may be made of a metal having good electrical conductivity, such as aluminum, gold, etc. The display substrate may be a silicon-based display substrate. However, the display substrate is not limited to a silicon-based display substrate, and may be other types of display substrates.

Due to the arrangement of the second circuit board pads, the number of the circuit board pads may be slightly greater than the number of the substrate pads.

In an embodiment, the first bonding region may be provided not only with two rows of circuit board pads, but also with three or more rows of circuit board pads. In a particular example, as shown in FIGS. 3 to 6, two rows of circuit board pads 5 are arranged on the circuit board 2, and the circuit board pads 5 are all arranged in a first direction; a row of substrate pads 6 is arranged on the display substrate 1, and the substrate pads 6 are arranged in the first direction; the circuit board pads 5 and the substrate pads 6 are bonded by the wires 4.

In a particular example, as shown in FIGS. 3 to 5, the circuit board 2 is provided with two rows of circuit board pads 5, and the circuit board pads 5 are all arranged in a first direction; a row of substrate pads 6 is arranged on the display substrate 1, and the substrate pads 6 are arranged in a first direction; the circuit board pads 5 and the substrate pads 6 are bonded by the wires 4.

In some embodiments, as shown in FIGS. 4 and 5, the at least two rows of circuit board pads include a first row of circuit board pads and a second row of circuit board pads, the substrate pads include a plurality of groups of first pads 61 for transmitting high-speed differential signals and second pads 62 other than the first pads, each group of the first pads includes two first pads 61 without any second pads 62 provided between the two first pads 61, and at least one second pad 62 is provided between two adjacent groups of first pads 61.

In order to ensure the integrity of the high-speed differential signals, wires 4 connected to the same group of first pads 61 need to meet the requirement of equal length and width, and lengths of wires for connecting each group of first pads with the corresponding circuit board pads are equal.

In order to ensure the integrity of the high-speed differential signals, as shown in FIG. 4, all of the first pads 61 are bonded in one-to-one correspondence to the circuit board pads of the first row of circuit board pads. The number of first pads 61 may or may not be equal to the number of circuit board pads of the first row of circuit board pads. In an embodiment, the first pads 61 in the same group are connected to two closest circuit board pads in the same row, and the wires 4 connected to the first pads 61 in same group can meet the requirement of having the equal length and width, thereby ensuring the integrity of high-speed differential signals.

In some embodiments, in order to reduce the length of the wire 4 connected to the first pads 61, the second row of circuit board pads may be located on a side of the first row of circuit board pads away from the display substrate. Of course, the second row of circuit board pads may also be located on a side of the first row of circuit board pads close to the display substrate.

When the second row of circuit board pads are located on the side of the first row of circuit board pads away from the display substrate, a length of a wire connected between the second row of circuit board pads and the substrate pad is greater than a length of a wire connected between the first row of circuit board pads and the substrate pad.

In some embodiments, as shown in FIG. 4, since the first pads are all bonded and connected to the first row of circuit board pads, and the number of circuit board pads bonded to the second pads is relatively small in the second row of circuit board pads. In order to ensure the uniform arrangement of the second row of circuit board pads, the second row of circuit board pads includes first circuit board pads 53 and second circuit board pads 52, the first circuit board pads 53 and the second circuit board pads 52 are arranged alternately, the second circuit board pads 52 are not provided with a wire bonded to the substrate pads. In order to ensure a reliable connection between the first circuit board pads and the substrate pads, the area of the first circuit board pad 53 may be larger than the area of the second circuit board pad 52.

In some embodiments, since the first pads are all bonded and connected to the first row of circuit board pads, and the number of circuit board pads bonded to the second pads needs to be relatively small in the second row of circuit board pads, and the second row may be provided with a smaller number of circuit board pads. In order to ensure the uniform arrangement of the second row of circuit board pads, the distance between the first row of circuit board pads (namely, the distance between adjacent circuit pads in the first row of circuit board pads) is smaller than the distance between the second row of circuit board pads (namely, the distance between adjacent circuit pads in the second row of circuit board pads). For example, the distance between adjacent circuit board pads in the first row of circuit board pads is d, and the width of the circuit board pad in the first direction is S; the distance between adjacent circuit board pads in the second row of circuit board pads is 2d+S. By means of the technical solution of the present embodiment, it can be ensured that two signal wires of the same pair of high-speed differential signals are on the same side of the circuit board pads in the bonding process, so as to ensure the integrity of the high-speed differential signals.

In some embodiments, since the substrate pads arranged in one row occupy a relatively small layout space, and the circuit board pads arranged in two rows occupy a relatively large layout space, the area of the first circuit board pad is greater than the area of the substrate pad, and the area of the second circuit board pads is greater than the area of the substrate pads, so that the difficulty of bonding can be reduced.

In some embodiments, as shown in FIG. 5, the second circuit board pads 52 are located in the middle of the second row of circuit board pads. Of course, the second circuit board pads 52 are not limited to being located in the middle of the second row of circuit board pads, but may be located in other regions of the second row of circuit board pads.

In some embodiments, since the distance between the second row of circuit board pad and the substrate pad is larger, and the bonding angle of the second row of circuit board pads may be reduced, an included angle between a first orthographic projection of a connecting line between the first row of circuit board pad and the substrate pad onto the circuit board and an extending direction of the first row of circuit board pads is smaller than an included angle between a first orthographic projection of a connecting line between the second row of circuit board pad and the substrate pad onto the circuit board and an extending direction of the second row of circuit board pads.

In some embodiments, in order to prevent the wire 4 from contacting the circuit board pads, the length of a wire for connecting each group of first pads to a corresponding circuit board pad is greater than a distance between the first row of circuit board pad and the second row of circuit board pad in a second direction, the second direction being perpendicular or substantially perpendicular to the first direction.

In order to prevent contact between different wires 4, as shown in FIGS. 3 and 4, the circuit board pads in the first row of circuit board pads are staggered from the circuit board pads in the second row of circuit board pads in the first direction, and the circuit board pads in the adjacent two rows of circuit board pads are staggered by a set distance in the first direction.

In some embodiments, the set distance may be one half of S, S is a width of the circuit board pad in the first direction. Of course, the set distance is not limited to one half of S, but may be another value.

In this embodiment, by providing multiple rows of circuit board pads, the number of circuit board pads in a single row can be reduced, the width of the first bonding region is reduced, and the first bonding region may be closer to the middle of the display substrate, so that the distance between a circuit board pad at the edge of the first bonding region and a substrate pad at the edge of the second bonding region is reduced as far as possible. As such, the length of the wire 4 can be reduced, the included angle between the wire 4 and the second direction can be smaller than a second preset threshold, and the bonding angle can be increased, thereby to ensure the reliability of the wire bonding process. The second direction is perpendicular or substantially perpendicular to the first direction.

In order to minimize the width of the first bonding region in the first direction, a maximum width of the circuit board pad 5 in a second direction is greater than a maximum width of the circuit board pad 5 in the first direction, the second direction being perpendicular or substantially perpendicular to the first direction.

In some embodiments, in order to reduce the width of the first bonding region in the second direction, a distance between the first row of circuit board pads and the second row of circuit board pads is smaller than a distance between adjacent circuit board pads in the first row of circuit board pads.

In some embodiments, an orthographic projection of the first bonding region in the first direction exceeds an orthographic projection of the second bonding region in the first direction, and a minimum distance between a first boundary of the first bonding region in a second direction and a second boundary of the second bonding region in the second direction is smaller than a first preset threshold, the second direction being perpendicular to the first direction. This ensures that a distance between the circuit board pad at the edge of the first bonding area and the substrate pad at the edge of the second bonding area is as small as possible. Of course, in an embodiment, an extending length of the first bonding region in the first direction may be greater than an extending length of the second bonding region in the first direction.

In some embodiments, an orthographic projection of the first bonding region in the first direction may be located within an orthographic projection of the second bonding region in the first direction. This ensures that the distance between the circuit board pad at the edge of the first bonding area and the substrate pad at the edge of the second bonding area is as small as possible.

In some embodiments, as shown in FIG. 3, the first row of circuit board pads are bonded to the substrate pads via first wires, the second row of circuit board pads are bonded to the substrate pads via second wires, the second row of circuit board pads are located on a side of the first row of circuit board pads away from the display substrate, the first wire and the second wire are arc-shaped wires, and the first wire is located on a side of the second wire close to the circuit board. In an embodiment, arcs of two wires are designed with different heights, which can avoid mutual interference between wires bonded to two rows of circuit board pads.

In some embodiments, the display region of the display substrate includes a plurality of sub-pixels, a distance between the first row of circuit board pad and the second row of circuit board pad in a second direction is greater than a maximum width of one of the sub-pixels, the second direction being perpendicular or substantially perpendicular to the first direction. In this way, mutual interference between wires bonded to two rows of circuit board pads can be prevented.

It should be noted that the various embodiments in this specification are described in a progressive manner, the same or similar parts of the various embodiments can refer to each other, and each embodiment focuses on differences from the other embodiments. In particular, the method embodiments are described more simply because they are substantially similar to the product embodiments, and for the interrelated part, the partial description of the product embodiments may be referred to.

Unless defined otherwise, technical or scientific terms used in this disclosure shall have the ordinary meaning as understood by one of ordinary skill in the art to which this disclosure belongs. Such terms as "first", "second" used herein do not denote any order, quantity, or importance, but rather are used to distinguish one element from another. Such terms as "comprise" or "include" mean that the presence of an element or item preceding the word covers the presence of the element or item listed after the word and equivalents thereof, but does not exclude other elements or items. Such terms as "connecting" or "connected" are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the above embodiments, particular features, structures, materials, or characteristics may be combined in any suitable manner in any one or more embodiments or examples.

The above implementations are just specific embodiments of the present disclosure, but the protection scope of the present disclosure is not limited thereto. A person of ordinary skill in the art can think of changes or equivalents within the technical scope of the present disclosure, which shall fall within the protection scope of the present disclosure. Therefore, the protection scope of the present disclosure shall be subjected to the claims.

What is claimed is:

1. A display module, comprising:
   a circuit board, wherein the circuit board comprises a first bonding region, the first bonding region is provided with two rows of circuit board pads, and each row of circuit board pads comprises a plurality of circuit board pads arranged at intervals in a first direction; and
   a display substrate on the circuit board, wherein the display substrate comprises a second bonding region, the second bonding region is provided with a plurality of substrate pads arranged in the first direction, an orthographic projection of the display substrate onto the circuit board does not overlap the first bonding region, and the second bonding region is close to the first bonding region,
   wherein the circuit board pads are bonded to the substrate pads via suspended wires;
   wherein the two rows of circuit board pads comprise a first row of circuit board pads and a second row of circuit board pads,
   the second row of circuit board pads comprises first circuit board pads and second circuit board pads, the first circuit board pads and the second circuit board pads are arranged alternately, the second circuit board pads are not provided with a wire bonded to the substrate pads, and a distance between the first row of circuit board pads is smaller than a distance between the second row of circuit board pads.

2. The display module according to claim 1, wherein an area of an orthographic projection of one of the first circuit board pads onto the display substrate is greater than an area of an orthographic projection of one of the second circuit board pads onto the display substrate.

3. The display module according to claim 1, wherein an area of an orthographic projection of one of the first circuit board pads onto the display substrate is greater than an area of one of the substrate pads, and an area of an orthographic projection of one the second circuit board pads onto the display substrate is greater than the area of one of the substrate pads.

4. The display module according to claim 1, wherein in the second row of circuit board pads, the first circuit board pads and the second circuit board pads are arranged alternately, and the number of the first circuit board pads is equal to the number of the second circuit board pads.

5. The display module according to claim 1, wherein the substrate pads comprise a plurality of groups of first pads configured to transmit high-speed differential signals and second pads other than the first pads, each group of first pads comprises two first pads without any second pad arranged therebetween, at least one of the second pads is provided between two adjacent groups of first pads, and lengths of wires connected between first pads in each group of first pads and corresponding circuit board pads are equal.

6. The display module according to claim 5, wherein a length of a wire connected between each group of first pads and a corresponding one of the circuit board pads is larger than a distance between the first row of circuit board pads and the second row of circuit board pads in a second direction, the second direction being perpendicular or substantially perpendicular to the first direction.

7. The display module according to claim 1, wherein a length of a wire for connecting one of the second row of circuit board pads with a corresponding one of the substrate pads is greater than a length of a wire for connecting one of the first row of circuit board pads with a corresponding one of the substrate pads.

8. The display module according to claim 1, wherein a maximum width of one of the circuit board pads in a second direction is greater than a maximum width of the one circuit board pad in the first direction, the second direction being perpendicular or substantially perpendicular to the first direction.

9. The display module according to claim 1, wherein the second circuit board pads are located in the middle of the second row of circuit board pads.

10. The display module according to claim 1, wherein an included angle between a first orthographic projection of a connecting line between one of the first row of circuit board pads and a corresponding one of the substrate pads onto the circuit board and an extending direction of the first row of circuit board pads is smaller than an included angle between a first orthographic projection of a connecting line between one of the second row of circuit board pads and a corresponding one of the substrate pads onto the circuit board and an extending direction of the second row of circuit board pads.

11. The display module according to claim 1, wherein a distance between the first row of circuit board pads and the second row of circuit board pads is smaller than a distance between adjacent circuit board pads in the first row of circuit board pads.

12. The display module according to claim 1, wherein an orthographic projection of the first bonding region in the first direction exceeds an orthographic projection of the second bonding region in the first direction, and a minimum distance between a first boundary of the first bonding region in a second direction and a second boundary of the second bonding region in the second direction is smaller than a first preset threshold, the second direction being perpendicular or substantially perpendicular to the first direction.

13. The display module according to claim 1, wherein an orthographic projection of the first bonding region in the first direction is located within an orthographic projection of the second bonding region in the first direction.

14. The display module according to claim 1, wherein included angles between the wires and a second direction are less than a second preset threshold, the second direction being perpendicular or substantially perpendicular to the first direction.

15. The display module according to claim 1, wherein an extending length of the first bonding region along the first direction is larger than an extending length of the second bonding region along the first direction.

16. The display module according to claim 1, wherein circuit board pads in the first row of circuit board pads are staggered, in the first direction, from circuit board pads in the second row of circuit board pads.

17. The display module according to claim 1, wherein a display region of the display substrate comprises a plurality of sub-pixels, and a distance between the first row of circuit board pads and the second row of circuit board pads in a second direction is larger than a maximum width of one of the sub-pixels, the second direction being perpendicular or substantially perpendicular to the first direction.

18. The display module according to claim 1, wherein a maximum width of one of the second circuit board pads in a second direction is smaller than a maximum width of one of the first circuit board pads in the second direction, the second direction being perpendicular or substantially perpendicular to the first direction; or, wherein the number of the first circuit board pads is greater than the number of the second circuit board pads.

19. A display device, comprising the display module according to claim 1.

20. A method for manufacturing a display module, comprising:

providing a circuit board, wherein the circuit board comprises a first bonding region, the first bonding region is provided with two rows of circuit board pads each row of circuit board pads comprises a plurality of circuit board pads arranged at intervals in a first direction;

forming a display substrate on the circuit board, wherein the display substrate comprises a second bonding region, the second bonding region is provided with a plurality of substrate pads arranged in the first direction, an orthographic projection of the display substrate onto the circuit board does not overlap the first bonding region, and the second bonding region is close to the first bonding region; and forming suspended wires for bonding the circuit board pads to the substrate pads, wherein the two rows of circuit board pads comprise a first row of circuit board pads and a second row of circuit board pads, the second row of circuit board pads comprises first circuit board pads and second circuit board pads, the first circuit board pads and the second circuit board pads are arranged alternately, the second circuit board pads are not provided with a wire bonded to the substrate pads, and a distance between the first row of circuit board pads is smaller than a distance between the second row of circuit board pads.

\* \* \* \* \*